United States Patent
Rowlette (10) Patent No.: US 9,077,137 B2
(45) Date of Patent: Jul. 7, 2015

(54) LASER ASSEMBLY WITH PACKAGE BEAM POINTING REGISTRATION

(71) Applicant: DAYLIGHT SOLUTIONS, INC., San Diego, CA (US)

(72) Inventor: Jeremy A. Rowlette, Palo Alto, CA (US)

(73) Assignee: DAYLIGHT SOLUTIONS, INC., San Diego, CA (US)

(*) Notice: Subject to any disclaimer, the term of this patent is extended or adjusted under 35 U.S.C. 154(b) by 328 days.

(21) Appl. No.: 13/790,403

(22) Filed: Mar. 8, 2013

(65) Prior Publication Data
US 2014/0251964 A1 Sep. 11, 2014

(51) Int. Cl.
| H01S 3/13 | (2006.01) |
| H01S 5/022 | (2006.01) |
| H01S 3/139 | (2006.01) |
| H01S 3/136 | (2006.01) |
| H01S 5/00 | (2006.01) |
| H01S 5/02 | (2006.01) |
| H01S 5/14 | (2006.01) |
| H01S 5/34 | (2006.01) |

(52) U.S. Cl.
CPC ............ *H01S 5/02208* (2013.01); *H01S 3/139* (2013.01); *H01S 3/136* (2013.01); *H01S 3/1306* (2013.01); *H01S 3/1305* (2013.01); *H01S 3/13* (2013.01); *H01S 5/0014* (2013.01); H01S 5/005 (2013.01); H01S 5/02 (2013.01); H01S 5/0222 (2013.01); H01S 5/141 (2013.01); H01S 5/3401 (2013.01)

(58) Field of Classification Search
CPC ....... H01S 3/169; H01S 3/136; H01S 3/1306; H01S 3/1305; H01S 3/13

USPC ................ 372/29.022, 29.021, 29.02, 33
See application file for complete search history.

(56) References Cited

U.S. PATENT DOCUMENTS

| 6,134,257 A | 10/2000 | Capasso et al. |
| 6,400,744 B1 | 6/2002 | Capasso et al. |
| 7,424,042 B2 | 9/2008 | Day et al. |
| 7,466,734 B1* | 12/2008 | Day et al. ............ 372/39 |
| 7,492,806 B2 | 2/2009 | Day et al. |
| 7,496,120 B2* | 2/2009 | Wang et al. ......... 372/29.02 |
| 7,535,656 B2 | 5/2009 | Day et al. |
| 7,535,936 B2* | 5/2009 | Day et al. ............ 372/20 |
| 7,733,925 B2 | 6/2010 | Pushkarsky et al. |
| 7,796,341 B2 | 9/2010 | Day et al. |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 8,442,081 B2 | 5/2013 | Marsland, Jr. et al. |
| 8,467,430 B2 | 6/2013 | Caffey et al. |
| 8,565,275 B2* | 10/2013 | Pushkarsky et al. ......... 372/32 |

\* cited by examiner

*Primary Examiner* — Kinam Park
(74) *Attorney, Agent, or Firm* — Roeder & Broder LLP (57) ABSTRACT

A laser assembly (12) for providing an output beam (18) includes a gain medium (16) and a laser housing (20) that retains the gain medium (16). The gain medium (16) generates the output beam (18) when electrical power is directed to the gain medium (16). The laser housing (20) includes a reference redirector (20A) that is used to a reference datum to check the alignment of the output beam (18) relative to the laser housing (20). The reference redirector (20A) can be a mirror that is integrated into the laser housing.

23 Claims, 5 Drawing Sheets

LASER ASSEMBLY WITH PACKAGE BEAM POINTING REGISTRATION

BACKGROUND

Laser assemblies are also useful in many other applications. A typical laser assembly includes a laser housing, and a gain medium that generates an output beam when power is directed to the gain medium. In many assemblies, it is important for the output beam of the laser assembly to be accurately aligned with the other components of the assembly, and to maintain the alignment with the other components during the operation of the assembly.

Unfortunately, it can be very difficult to determine if the output beam generated by the gain medium is properly aligned with respect to the other components of a larger system assembly containing the laser assembly. Further, it can be very difficult to determine if the alignment of the output beam has shifted during the operation of the system containing the laser assembly.

SUMMARY

The present invention is directed to a laser assembly for providing an output beam directed along an output axis. The laser assembly includes (i) a gain medium that generates the output beam directed along the output axis when electrical power is directed to the gain medium; and (ii) a laser housing that retains the gain medium, the laser housing including a reference redirector. In certain embodiments, the reference redirector is used as a reference datum to check the alignment of the output beam relative to the laser housing. In certain embodiments, the reference redirector is a mirror that is integrated into the laser housing. For example, the reference redirector can be surface that is fabricated into the laser housing for example a diamond tipped machining blade. Further, the reference redirector can include a reflector surface that is at an angle of between approximately eighty to ninety degrees relative to the output axis.

In one embodiment, the laser housing includes an output wall that includes a transparent window that allows the output beam to pass there through while maintaining a sealed environment to the inner volume of the laser package assembly, and the reference redirector is formed on an outer (external) surface of the front wall of the laser package. Further, the laser assembly can include a mirror component that is secured to the external wall of the laser housing through mechanical clamps or an adhesive or a combination of the two. In this embodiment, the position of the mirror relative to the laser housing can be adjusted to adjust the position of the output axis relative to the laser housing.

As non-exclusive examples, the gain medium is a quantum cascade or an interband cascade gain medium.

Additionally, the present invention is directed to an assembly that includes the laser assembly, and a test assembly that directs a reference beam at the reference redirector to check the alignment of the output beam relative to the laser housing. In one embodiment, the test assembly splits the output beam to create the reference beam that is directed at the reference redirector. In another embodiment, the test assembly includes a test laser source that generates the reference beam that is directed at the reference redirector.

In another embodiment, the present invention is directed to a laser assembly that includes (i) a gain medium that generates the output beam directed along the output axis when electrical power is directed to the gain medium; and (ii) a laser housing that retains the gain medium, the laser housing including a reference redirector that is used to check the alignment of the output beam relative to the laser housing. In this embodiment, the reference redirector can be a mirror that is integrated into the laser housing, and the reference redirector is used as a reference datum for precision angular alignment of the output beam relative to the laser housing.

In yet another embodiment, the present invention is directed to a method for checking the alignment of an output beam directed along an output axis. In this embodiment, the method includes the steps of: (i) directing power to a gain medium that emits the output beam; (ii) retaining the gain medium with a laser housing that includes a reference redirector; and (iii) directing a reference beam at the reference redirector to check the alignment of the output beam relative to the laser housing.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
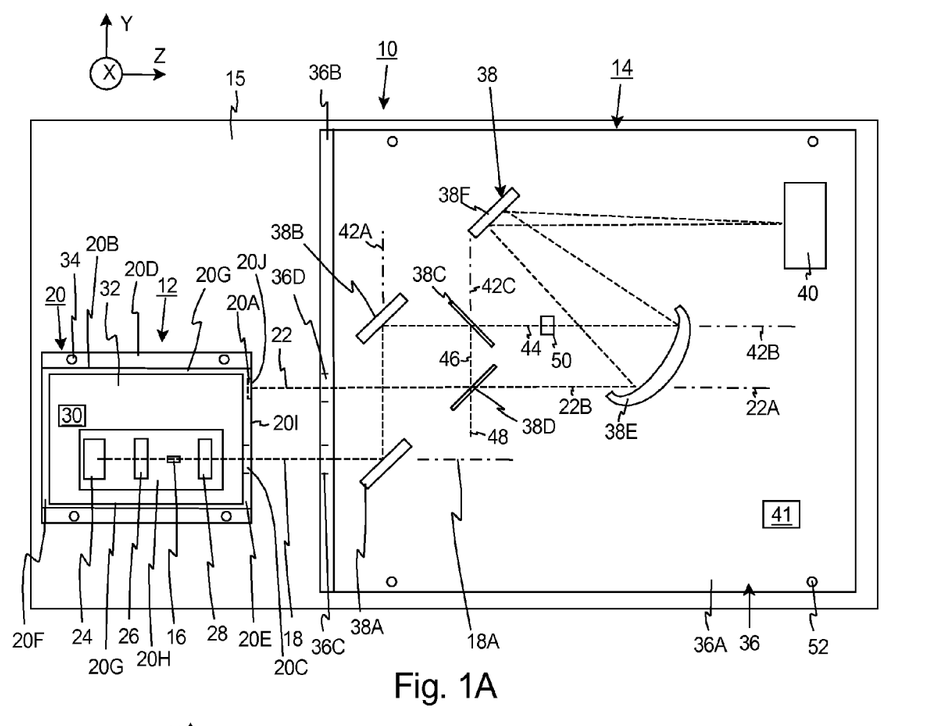
FIG. 1A is a simplified top plan view of a laser assembly and a test assembly having features of the present invention.

FIG. 1A illustrates an assembly 10 that includes a first embodiment of a laser assembly 12, a test assembly 14 that can be used to test the laser assembly 12, and a rigid mounting base 15 that retains the laser assembly 12 and the test assembly 14. The laser assembly 12 includes a gain medium 16 that generates an output beam 18 (illustrated with a dashed line) directed along an output axis 18A, a laser housing 20 (sometime referred to as a "package") that retains the gain medium 16. In certain embodiments, the laser housing 20 includes a reference reflector 20A (e.g. a mirror) that functions as a reference datum for precision angular beam alignment. The design of each of these components can be varied pursuant to the teachings provided herein.

As an overview, in certain embodiments, the test assembly 14 can direct a reference beam 22 (illustrated with a dashed line) at the reference reflector 20A to test the alignment of the output beam 18 (and the output axis 18A) relative to the laser housing 20 and the laser assembly 12. For example, during the manufacturing of the laser assembly 12, the information regarding the alignment of the output beam 18 relative to the laser housing 20 can be used as feedback to guide the adjustment of one or more components of the laser assembly 10 to achieve the desired alignment of the output beam 18 and the laser housing 20. Further, in-situ, the information regarding the alignment of the output beam 18 relative to the laser housing 20 can be used to evaluate the operation characteristics of laser assembly 12 and/or whether one or more of the components of the laser assembly 12 has moved relative and the laser housing 20. With this design, the reference reflector 20A and the test assembly 14 can be used to make sure that the output beam 18 is pointed in the desired direction relative to the laser housing 20.

Some of the Figures include an orientation system that illustrates an X axis, a Y axis that is orthogonal to the X axis, and a Z axis that is orthogonal to the X and Y axes. It should be noted that these axes can also be referred to as the first, second and third axes. Additionally, the labeling of the orientation system is merely for purposes of reference and the orientation system as provided in the Figures is not intended to define the specific X, Y and Z axes. Rather, the X axis as utilized and/or described herein can be any axis that is parallel to the X axis on the orientation system, the Y axis as utilized and/or described herein can be any axis that is parallel to the Y axis on the orientation system, and the Z axis as utilized and/or described.

The laser assembly 12 generates the output beam 18 when sufficient electrical power is directed to the gain medium 16. The design and the number of component used in the laser assembly 12 can be varied to achieve the desired characteristics of the output beam 18. In one embodiment, the laser assembly 12 is an external cavity laser and the major components include the gain medium 16, the laser housing 20, a wavelength dependent ("WD") feedback assembly 24 that can be used to tune the primary wavelength of the output beam 18, a cavity lens 26, an output lens 28, and a control system 30 that directs power to the gain medium 16. Alternatively, for example, the laser assembly 12 can be designed without the external cavity. The laser assembly 12 can be powered by a generator (not shown), a battery (not shown), or another power source (not shown).

There are a number of possible usages for the laser assembly 12 disclosed herein. For example, the laser assembly 12 can be used in a variety of applications, such as testing, measuring, diagnostics, pollution monitoring, leak detection, security, pointer tracking, jamming a guidance system, analytical instruments, infrared microscopes, imaging systems, homeland security and industrial process control, and/or a free space communication system. It should be noted that this is a non-exclusive list of possible applications.

In one embodiment, the laser assembly 12 is a mid-infrared ("MIR") laser that generates a narrow linewidth, accurately settable output beam 18 that is in the mid-infrared range. Alternatively, the laser assembly 12 can be designed so that the output beam 18 is outside the mid-infrared range.

The gain medium 16 generates the output beam 18 when electrical power is directed to the gain medium 16. In one, non-exclusive embodiment, the gain medium 16 is a quantum cascade ("QC") gain medium. Alternatively, the gain medium 16 can be an Interband Cascade Lasers (ICL), or another type of gain medium.

In one embodiment, the gain medium 16 includes (i) a first facet that faces the cavity lens 26 and the WD feedback assembly 24, and (ii) a second facet that faces the output lens 28. In this embodiment, the gain medium 16 emits from both facets. In one embodiment, the first facet is coated with an anti-reflection ("AR") coating and the second facet is coated with a reflective coating.

The laser housing 20 houses, encloses, and/or retains many of the components of the laser assembly 12. In FIG. 1A, the laser housing 20 encloses and retains the gain medium 16, the output lens 28, the cavity lens 26, the WD feedback assembly 24, and the control system 30. In one non-exclusive embodiment, the laser housing 20 defines a housing chamber 32 that can provide a controlled environment for the components within the housing chamber 32. For example, the laser housing 20 can be hermetically sealed, or can be filled with an inert gas, or another type of fluid, or the laser housing 20 can be subjected to vacuum.

In FIG. 1A, the laser housing 20 can include a housing body 20B, a removable top (not shown in FIG. 1A so that the components within the laser housing 20 are visible), and a window transparent to the laser beam 20C (illustrated in phantom) that allows the output beam 18 to exit the laser housing 20 directed along the output axis 18A. In one embodiment, the housing body 20B and the top cooperated to define a rigid, generally hollow shaped rectangular box that may or may not conform initially to telecommunications laser packaging industry standards such as commercially available "butterfly" packages. In this embodiment, the housing body 20B can include a body bottom 20D, a front output wall 20E that retains the window 20C, a rear wall 20F, and two side walls 20G. With, design, the walls 20E-20G cantilever upward from the body bottom 20D, and the walls 20E-20G are arranged in a rectangular pattern.

In one embodiment, the housing body 20B is made of a material having a relatively high coefficient to thermal conductivity (e.g. at least approximately 170 watts/meter K) so that heat from the gain medium 16 can be readily transferred. Further, the housing body 20B can be fabricated from a single, monolithic structure made of aluminum, copper, copper-tungsten, aluminum-silicon-carbide (AlSiC) or other material having a sufficiently high thermal conductivity. In other embodiments, the walls of the laser package may be braised into the base of the package and can be made of a lower thermal conductivity material such as covar, AlN, alumina, and copper-tungsten alloys with high tungsten fraction. The one piece structure of the housing body 20B maintains the fixed relationship of the components mounted thereto, and provides structural integrity.

In FIG. 1A, the laser housing 20 retains the gain medium 16, the WD feedback assembly 24, the lenses 26, 28, and the widow 20C in fixed, stable alignment along the output axis 18A. The laser housing 20 can include a thermal mount 20H that retains the gain medium 16, the WD feedback assembly 24, and the lenses 26, 28, and that readily transfers heat from the gain medium 16 to the housing body 20B.

As provided above, uniquely, the laser housing 20 includes the reference redirector 20A that redirects the reference beam 22 to test the alignment of the output beam 18 relative to the laser housing 20. The design and location of the reference redirector 20A can be varied pursuant to the teachings provided herein. In certain embodiments, the reference redirector 20A is a mirror that is integrated directly into the monolithic, unitary, housing body 20B. For example, the reference redirector 20A can be a diamond cut (highly polished) surface that is cut directly into the laser housing 20. More specifically, the reference redirector 20A can be a diamond cut surface that is cut directly into one of the walls 20E-20G. In FIG. 1A, the reference redirector 20A is a diamond cut surface that is cut directly into an outer surface 20I of the front output wall 20E.

When the reference redirector 20A is directly integrated into the laser housing 20, the likelihood of the reference redirector 20A shifting relative to the rest of the laser housing 20 is greatly reduced. Alternatively, the reference redirector 20A can be a mirror that is fixedly secured (e.g. with an adhesive) to the laser housing 20.

Figure 2A:
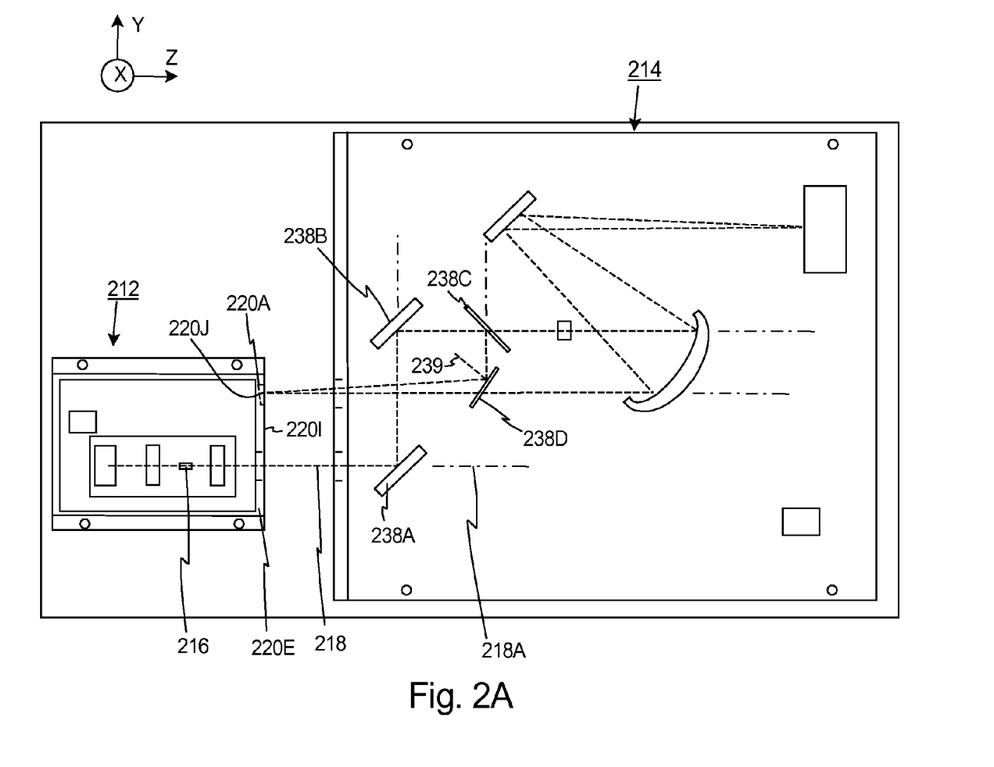
FIG. 2A is a simplified top plan view of another embodiment of the laser assembly and the test assembly.

In one embodiment, the reference redirector 20A includes a reflector surface 20J that is (ii) approximately parallel to the outer surface 20I of the front output wall 20E and (ii) an approximately perpendicular to the desired output axis 18A. Alternatively, the reflector surface 20J can be slightly skewed to as described below in reference to FIG. 2.

In FIG. 1A, the laser assembly 12 includes a housing mounting assembly 34 that secures the laser housing 20 to the mounting base 15. In certain embodiments, the housing mounting assembly 34 secures the laser housing 20 to the mounting base 15 in a fashion that does not distort the laser housing 20.

The WD feedback assembly 24 reflects light back to the gain medium 16 along the lasing axis, and is used to precisely adjust the lasing frequency of the external cavity and the wavelength of the output beam 18. The design of the WD feedback assembly 24 can vary pursuant to the teachings provided herein. Non-exclusive examples of suitable designs include a diffraction grating, a MEMS grating, prism pairs, a thin film filter stack with a redirector, an acoustic optic modulator, or an electro-optic modulator. A more complete discussion of these types of WD redirectors 490 can be found in the Tunable Laser Handbook, Academic Press, Inc., Copyright 1995, chapter 8, Pages 349-435, Paul Zorabedian. The WD feedback assembly 28 can be fixed or adjustable (e.g. a motor that moves a grating).

The cavity lens 26 is positioned between the gain medium 16 and the WD feedback assembly 24 along the lasing axis (e.g., along the Z axis), and collimates and focuses the light that passes between these components. For example, in one embodiment, the cavity lens 26 can include an aspherical lens having an optical axis that is aligned with the lasing axis.

The output lens 28 is positioned between the gain medium 16 and the window 20C in line with the lasing axis. Additionally, the output lens 28 collimates and focuses the light that exits the second facet of the gain medium 16. For example, the output lens 28 can be somewhat similar in design to the cavity lens 26. As provided herein, the position of the output lens 28 can be adjusted relative to the laser housing 20 to steer the output beam 18 and adjust the output axis 18A.

The control system 24 directs power to the gain medium 16. For example, the control system 24 can direct power the gain medium 16 in a continuous or pulsed fashion.

The gain medium 16 can generate quite a bit of heat. Accordingly, in certain embodiments, the laser assembly 12 can include a temperature controller (not shown) that transfers the heat away from the gain medium 16 to control the temperature of the gain medium 16. For example, the temperature controller can include one or more thermoelectric coolers ("TEC") that transfer the heat to the mounting base 15.

In certain embodiments, the test assembly 14 directs the reference beam 22 at the reference reflector 20A and is used to test the alignment of the output beam 18 and the output axis 18A) relative to the laser housing 20. The design of test assembly 14 can be varied. In one non-exclusive embodiment, the test assembly 14 includes a test frame 36, a beam director assembly 38, a beam detector 40, and a test control system 41. In this embodiment, the test assembly 14 splits the output beam 18 to create the reference beam 22. With this design, an additional laser (not shown in FIG. 1A) is not needed to test the alignment of the laser assembly 12.

Figure 1B:
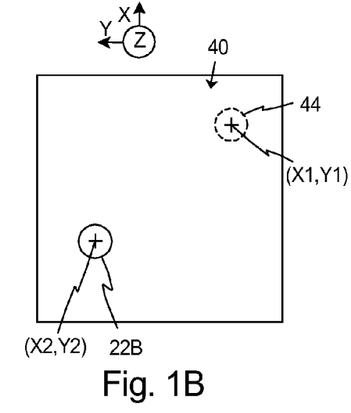
FIG. 1B is a simplified front view of a beam detector with the images of two beams thereon.

In FIG. 1B, test frame 36 is rigid, and includes a generally flat frame bottom 36A, and a frame wall 36B that cantilevers upward from the frame bottom 36A. Additionally, the frame wall 36B can include (i) a frame opening 36C (illustrated in phantom) that allows for the optical beam 18 to pass through the frame wall 36B, and (ii) a frame shutter 36D (illustrated in phantom) positioned in the path of the reference beam 22. With this design, the frame shutter 36D can be moved between an open position and a closed position. In one embodiment, in the open position, the reference beam 22 is allowed to exit the test assembly 14 directed at the reference redirector 20A along a reference axis 22A, and return to the test assembly 14 along the reference axis 22A. Alternatively, in the closed position, the reference beam 22 is not allowed to exit the test assembly 14 directed at the reference redirector 20A along the reference axis 22A.

The beam director assembly 38 directs the output beam 18 at the beam detector 40, directs the reference beam 22 at the reference redirector 20A, and directs the reference beam 22 reflected off of the reference redirector 20A at the beam detector 40. In certain embodiments, the beam director assembly 38 splits the output beam 18 to create the reference beam 22. In FIG. 1A, beam director assembly 38 includes (i) a first mirror 38A, a second mirror 38B, a first beam splitter 38C, a second beam splitter 38D, a redirector element 38E, and a third mirror 38F that are each fixedly secured to the frame bottom 36A to maintain the relative alignment of these components.

The first mirror 38A is positioned on the output axis 18A and the first mirror 38A redirects the output beam 18 ninety degrees along a first redirected axis 42A (parallel to the Y axis). The second mirror 38B is positioned in the path of the redirected output beam 18 along the first redirected axis 42A, and the second mirror 38B redirects the output beam 18 ninety degrees along a second redirected axis 42B (parallel to the Z axis). With this design, the first mirror 38A and the second mirror 38D cooperate to function similar to a periscope, and the second redirected axis 42B is substantially parallel to and spaced apart from the desired output axis 18A.

The first beam splitter 38C is positioned in the path of the redirected output beam 18 along the second redirected axis 42B. Further, the first beam splitter 38C splits the output beam 18 into (i) a primary output beam 44 that is transmitted through the first beam splitter 38C and directed at the redirector element 38E, and (ii) a secondary beam 46 that is redirected by the first beam splitter 38C ninety degrees along a third redirected axis 42C (parallel to the Y axis).

The second beam splitter 38D is positioned in the path of the secondary beam 46 along the third redirected axis 42C. Further, the second beam splitter 38D splits the secondary beam into (i) a first extra beam 48 that is transmitted through the second beam splitter 38D that is not used, and (ii) the reference beam 22 that is redirected ninety degrees along the reference axis 22A (substantially parallel to the Z axis and the desired output axis 18A).

In FIG. 1A, the rays from the reference beam 22 are moving from right to left along the reference axis 22A directed at the reference redirector 20A. Subsequently, in this embodiment, the rays of the reference beam 22 directed at the reference redirector 20A will be reflected by the reference redirector 20A back along the reference axis 22A (moving left to right) at the second beam splitter 38D. With this design, the second beam splitter 38D splits the returning reference beam 22 into (i) a remaining reference beam 22B that is transmitted through the second beam splitter 38D and directed at the redirector element 38E, and (ii) a second extra beam (not shown) that is redirected ninety degrees along the third redirected axis 42C and that is not used.

In FIG. 1A, the first mirror 38A, the second mirror 38B, the first beam splitter 38C, and the second beam splitter 38D are at an angle of approximately forty-five degrees to the incoming beam.

The redirector element 38E receives the primary output beam 44 and the remaining reference beam 22B and redirects these beams 44, 22B at the third mirror 38F. As a non-exclusive examples, the redirector element 38E can be a spherical mirror or a parabolic mirror. The third mirror 38F reflects the primary output beam 44 and the remaining reference beam 22B at the beam detector 40.

In one embodiment, the test assembly 12 additionally includes an output shutter 50 that can be used to selectively block the primary output beam 44. In the non-exclusive embodiment illustrated in FIG. 1A, the output shutter 50 is positioned along the second redirected axis 42B between the first beam splitter 38C and the redirector element 38E. With this design, the output shutter 50 can be moved between an open position and a closed position. In the open position, the primary output beam 44 is allowed to pass to the redirector element 38E and subsequently to the beam detector 40. Alternatively, in the closed position, the primary output beam 44 is blocked from passing to the redirector element 38E and to the beam detector 40.

The beam detector 40 is used to measure (i) the X and Y position where the primary output beam 44 impinges on the beam detector 40, and (ii) the X and Y position of where the remaining reference beam 22B impinges on the beam detector 40. With information regarding the positions of the primary output beam 44 and the remaining reference beam 22B, the alignment of the output beam 18 can be determined relative to the laser housing 20.

FIG. 1B is a simplified front plan illustration of the beam detector 40 with the primary output beam 44 and the remaining reference beam 22B imaged thereon. In this embodiment, the beam detector 40 includes a two dimensional array of pixels that are sensitive to the wavelength of these beams 44, 22B, and that can be used to determine the location of each beam 44, 22B. As a non-exclusive example, if the beams 44, 22B are in the MIR range, the beam detector 40 can be an MIR imager (e.g. a MIR camera).

In FIG. 1B, the (i) the primary output beam 44 impinges on the beam detector 40 at position X1, Y1, and (ii) the remaining reference beam 22B impinges on the beam detector 40 at position X2, Y2. In FIG. 1B, the image of the primary output beam 44 is offset from the image of the remaining reference beam 22B on the beam detector 40.

Referring to both FIGS. 1A and 1B, in one embodiment, it is desired that the output beam 18 be perpendicular to the front wall 20E. In this embodiment, when the output beam 18 is perpendicular to the front wall 20E, (i) the primary output beam 44 and the remaining reference beam 22B are collinear (two beams 44, 22B propagating parallel to each other), and (ii) the image of the primary output beam 44 and the image of the remaining reference beam 22B on the beam detector 40 are overlapping (image the same spot). As illustrated in FIG. 1B, the image of the primary output beam 44 is offset from the image of the remaining reference beam 22B on the beam detector 40. Thus, in this example, the output beam 18 is currently misaligned relative to the laser housing 20.

The test control system 41 receives information from the beam detector 40 and can be used to determine (i) the X and Y center position where the primary output beam 44 impinges on the beam detector 40, and (ii) the X and Y center position of where the remaining reference beam 22B impinges on the beam detector 40. Further, the test control system 41 can be used to determine if the output beam 18 is misaligned and/or how much the output beam 18 is misaligned. For example, the test control system 41 can include one or more processors that evaluate the X and Y positions of the images of the beams 44, 22B to determine the amount of misalignment. Alternatively, the functions of the test control system 41 can be performed manually.

In one embodiment, the misalignment error can be easily calculated using the X and Y position information of the beams 44, 22B. For example, the theta X misalignment of the output beam 18 can be calculated as follows: $\theta x = \Delta x/(2f)$, where (i) $\theta x$ is the angle of misalignment about the X axis, (ii) $\Delta x$ is the difference between X1 and X2, and (iii) f is the focal length of the redirector element 38E. Similarly, the theta Y misalignment of the output beam 18 can be calculated as follows: $\theta y = \Delta y/(2f)$, where (i) $\theta y$ is the angle of misalignment about the Y axis, (ii) $\Delta y$ is the difference between Y1 and Y2, and (iii) f is the focal length of the redirector element 38E.

As provided herein, if this test is performed in-situ, the information regarding the alignment of the output beam 18 relative to the laser housing 20 can be used to evaluate the operation characteristics of laser assembly 12 and/or whether one or more of the components of the laser assembly 12 has moved relative and the laser housing 20.

Alternatively, if this test is done during manufacturing, one or more of the components of the laser assembly 12 can be adjusted to adjust the position of the output axis 18A relative to the laser housing 20. In one embodiment, the position of the output lens 28 can be adjusted relative to the laser housing 20 to adjust the position of the output axis 18A relative to the laser housing 20 so that (i) the primary output beam 44 and the remaining reference beam 22B are collinear, and (ii) the images of the beams 44, 22B are overlapping.

Figure 1C:
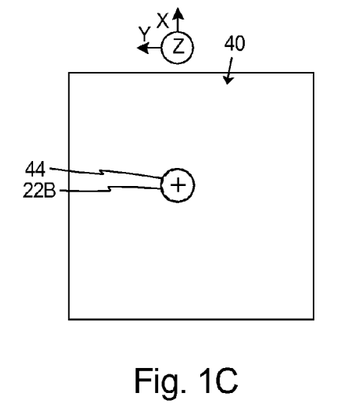
FIG. 1C illustrates the beam detector with the images of the two beams aligned thereon.

FIG. 1C is another simplified front plan illustration of the beam detector 40 with the primary output beam 44 and the remaining reference beam 22B imaged thereon after the position of the output lens 28 has been adjusted to correct the misalignment of the output beam 18. At this time, images of the beams 44, 22B are overlapping.

Referring back to FIG. 1A, in certain embodiments, it is desired to image only one of the beams 22B, 44 onto the beam detector 40 at a time. In these embodiments, the shutters 50, 36D can be used to alternatively image the beams 22B, 44 onto the beam detector 40. More specifically, (i) to image only the output beam 44 onto the beam detector 40, the frame shutter 36D is closed and the output shutter 50 is open; and (ii) to image only the reference beam 22B onto the beam detector 40, the frame shutter 36D is open and the output shutter 50 is closed.

In FIG. 1A, the test assembly 14 includes a test mounting assembly 52 that secures the test assembly 14 to the mounting base 15. In certain embodiments, the test mounting assembly 34 secures the test assembly 14 to the mounting base 15 in a fashion that does not distort the test assembly 14. In one embodiment, the test mounting assembly 52 includes a way to easily adjust the tip and/or tilt of the test assembly 14. With this design, the tip and tilt of the test assembly 14 can be adjusted so that the test assembly 14 is approximately in the same plane as the laser assembly 12.

The mounting base 15 is a rigid structure that retains the laser assembly 12 and the test assembly in a fixed, stable relationship. For example, the mounting base 15 can be an optical bench or a test stand.

Figure 1D:
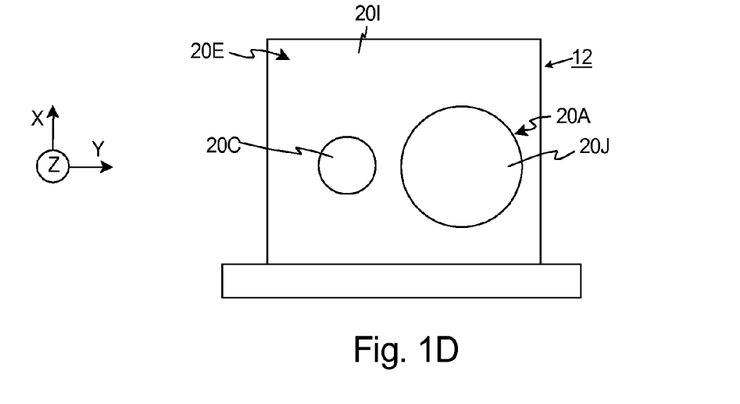
FIG. 1D is a front view of the laser assembly of FIG. 1A.

FIG. 1D is a front view of the laser assembly 12 of FIG. 1A, including the outer surface 20I of front wall 20E, the reflector surface 20J of the reference redirector 20A, and the window 20C.

FIG. 2A is a simplified top plan view of another embodiment of the laser assembly 212 and the test assembly 214 that are somewhat similar to the corresponding components described above. However, in this embodiment, the reflector surface 220J of the reference redirector 220A is skewed slightly from parallel to the outer surface 220I of the front wall 220E, and the second beam splitter 238D is also slightly skewed from how it is positioned in FIG. 1A. For example, the reflector surface 220J can be angled from approximately zero to ten degrees from being parallel to the front wall 220E, and the second beam splitter 238D can be skewed between approximately zero to ten degrees from forty-five degrees in order to compensate for the intentional skew of the reflector surface 220J and so as to create a beam parallel to the primary beam after reflection of the reflector surface 220J. With this design, the second extra beam 239 that is redirected by the second beam splitter 238D is not directed back to the gain medium 216 via the first beam splitter 238C and the mirrors 238A, 238B. This design therefore ensures that there is no optical feedback from the test apparatus 214 into the laser gain medium 216 which could cause laser instability of the laser beam direction, power and mode purity.

As provided herein, as a non-exclusive example, the reflector surface 220J can be (i) at an angle of between approximately eighty to ninety degrees relative to the desired output axis 218A of the output beam 218.

Figure 2B:
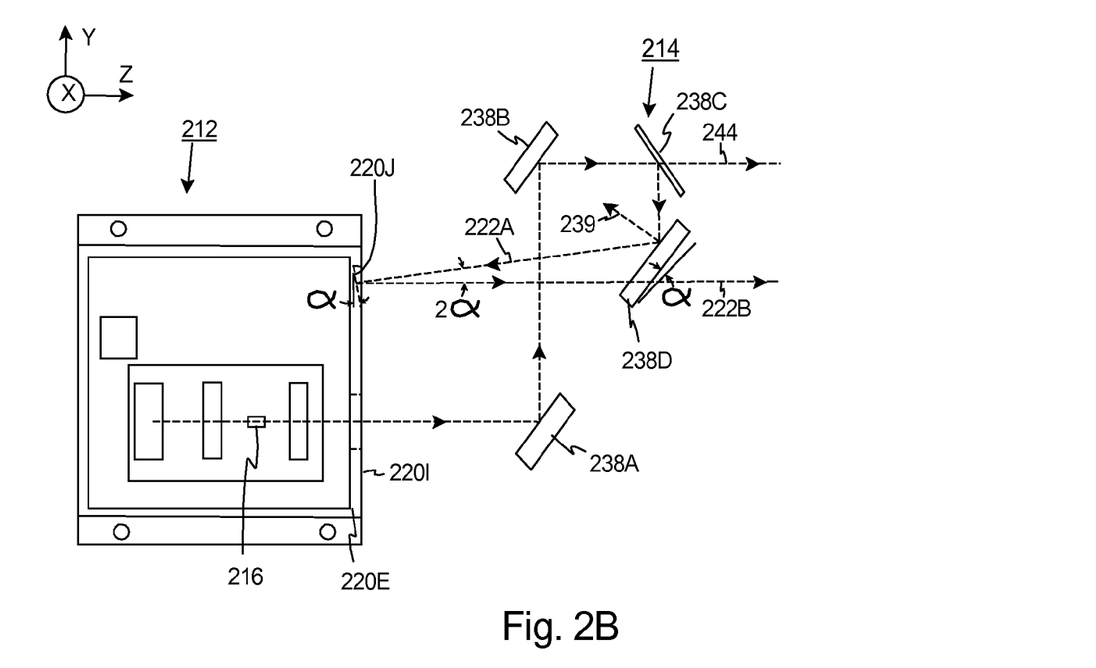
FIG. 2B is a simplified illustration of a portion of the laser assembly and test assembly of FIG. 2A.

FIG. 2B is a simplified illustration of the laser assembly 212 and a portion of the test assembly 214 of FIG. 2A. This Figure illustrates that the reflector surface 220J is skewed at an angle of α from parallel to the outer surface 220I of the front wall 220E, and the second beam splitter 238D is also skewed an angle of α from how it is positioned in FIG. 1A. For example, as provided above, the angle of α can be from approximately zero to ten degrees. With this design, the second extra beam 239 that is redirected by the second beam splitter 238D is not directed back to the gain medium 216 via the first beam splitter 238C and the mirrors 238A, 238B. Further, FIG. 2B illustrates that with this design, the incoming reference beam 222A (to the reflector surface 220J) is at an angle of 2α relative to the reflected reference beam 222B reflected off of the reflector surface 220J. Further, the reflected reference beam 222B is approximately parallel to the primary output beam 244.

Figure 2C:
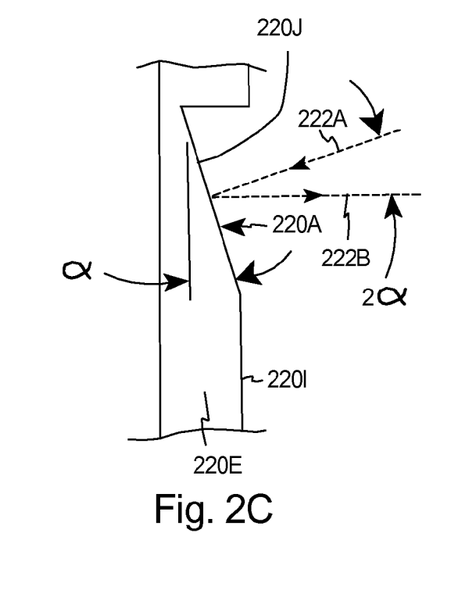
FIG. 2C is an enlarged view of a portion of the laser assembly of FIG. 2A.

FIG. 2C is an enlarged view of a portion of the front wall 220E including the reflector surface 220J of the reference redirector 220A that is skewed at the angle of α from parallel to the outer surface 220I of the front wall 220E. Further, the incoming reference beam 222A (to the reflector surface 220J) is at an angle of 2α relative to the reflected reference beam 222B reflected off of the reflector surface 220J. In this embodiment, the reflector surface 220J is integrated and formed directly into the front wall 220E.

Figure 2D:
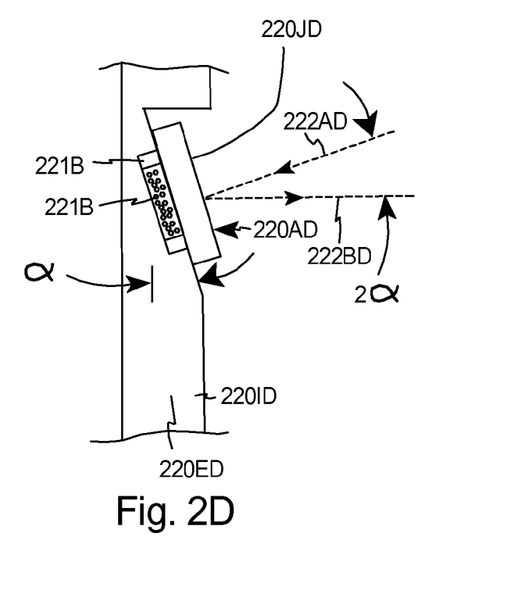
FIG. 2D is an enlarged view of another embodiment of a portion of a laser assembly.

FIG. 2D is an enlarged view of another embodiment of a portion of the front wall 220ED, and the reflector surface 220JD of the reference redirector 220AD that is skewed at the angle of α from parallel to the outer surface 220ID of the front wall 220ED. Further, the incoming reference beam 222AD (to the reflector surface 220JD) is at an angle of 2α relative to the reflected reference beam 222BD reflected off of the reflector surface 220JD. In this embodiment, the reference redirector 220AD is a mirror that is secured to the front wall 220ED with an adhesive 221A that fills a pocket 221B in the front wall 220ED.

Figure 3:
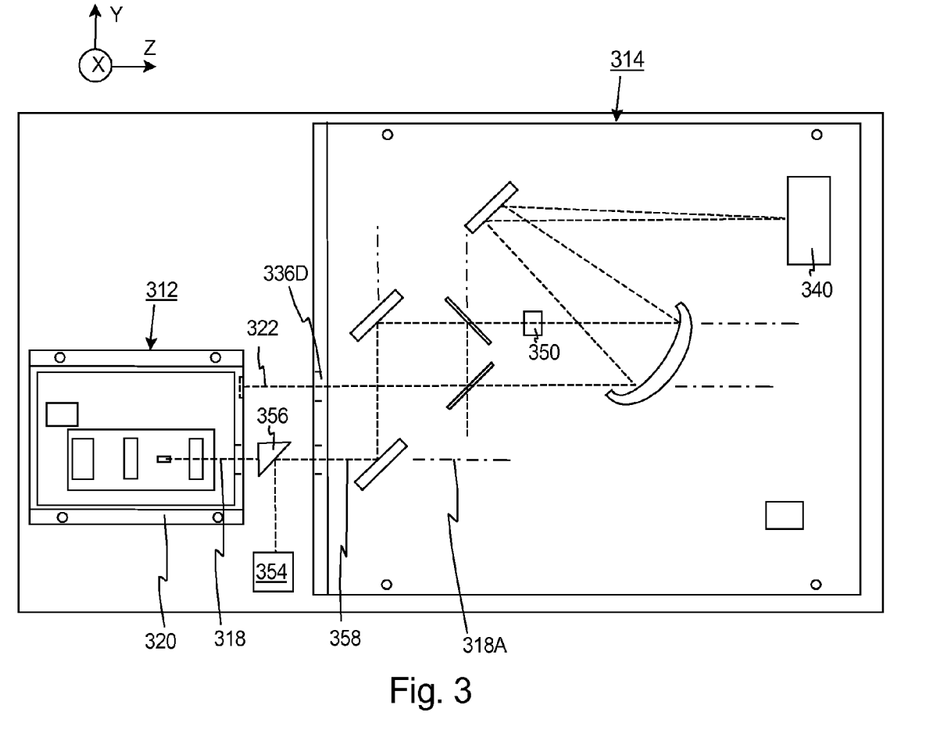
FIG. 3 is a simplified top plan view of another embodiment of the laser assembly and the test assembly.

FIG. 3 is a simplified top plan view of the laser assembly 312 and another embodiment of the test assembly 314. In this embodiment, the laser assembly 312 is similar to the laser assembly 12 described above in FIG. 1A, and the test assembly 314 is slightly different. More specifically, in this embodiment, the test assembly 314 includes a test laser source 354 and a test beam director 356 (e.g. a mirror) that are used to determine the alignment of the output beam 318 relative to the laser housing 320. For example, the test laser source 354 can generate the test beam 358 that is split to generate the reference beam 322.

The design of the test laser source 354 can be varied. For example, the test laser source 354 can generate the test beam 358 which is in the visible spectrum. As a non-exclusive example, the laser source 354 can be a HeNe laser.

In this embodiment, the laser assembly 312 is first operated (with the frame shutter 336D closed and without the test beam director 356 in place) to determine the position of the output beam 318 on the beam detector 340. Next, the test beam director 356 is installed along the output axis 318A. Subsequently, the test laser source 354 generates the test beam 358 (with the frame shutter 336D closed) and the position of the test beam 358 on the beam detector 340 is determined. Next, the frame shutter 336D is opened and the output shutter 350 is closed so that the location of the reference beam 322 on the beam detector 340 is determined.

With the information regarding the relative positions of the output beam 318, the test beam 358, and the reference beam 322 on the beam detector 340, the alignment of the created output beam 318 can be determined.

Figure 4:
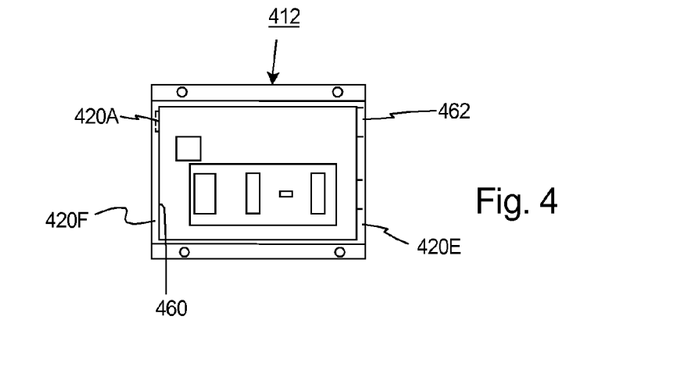
FIG. 4 is a simplified illustration of another embodiment of the laser assembly.

FIG. 4 is a simplified illustration of another embodiment of the laser assembly 412 that is similar to the laser assembly 12 described above and illustrated in FIG. 1A. As provided herein, the location of the reference redirector 420A can be varied to suit the design requirements of the system. In FIG. 4, the reference redirector 420A is integrated and cut into an inner surface 460 of the rear wall 420F, and the front wall 420E includes a window 462 that allows the reference beam (not shown in FIG. 4) to be directed at the reference redirector 420A.

Figure 5:
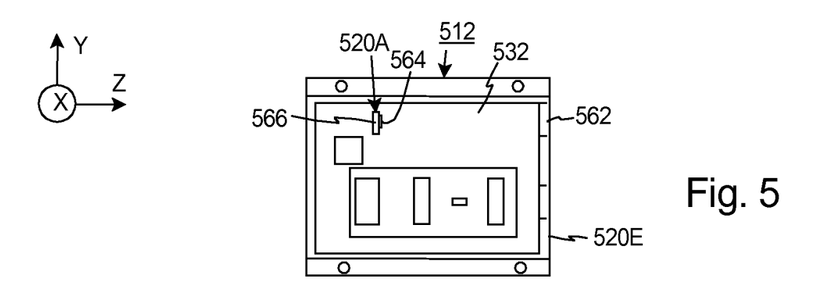
FIG. 5 is a simplified illustration of yet another embodiment of the laser assembly.

FIG. 5 is a simplified illustration of yet another embodiment of the laser assembly 512 that is similar to the laser assembly 12 described above and illustrated in FIG. 4. However, in this embodiment, the reference redirector 520A is a mirror 564 that is fixedly attached to or cut into a mirror beam 564 that cantilevers into the housing chamber 532. Further, in this embodiment, the front wall 520E again includes a window 562 that allows the reference beam (not shown in FIG. 5) to be directed at the reference redirector 520A.

Figure 6:
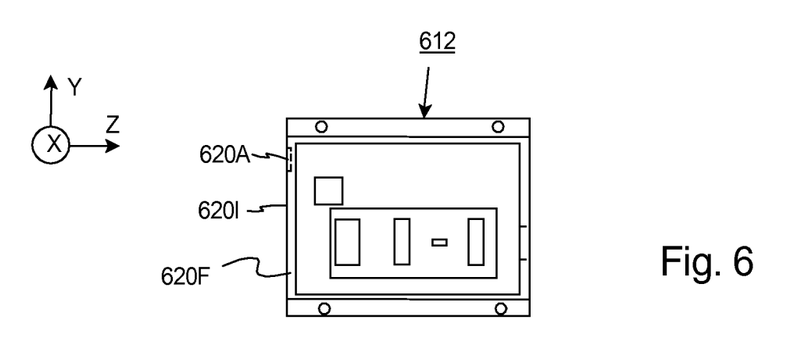
FIG. 6 is a simplified illustration of still another embodiment of the laser assembly.

FIG. 6 is a simplified illustration of yet another embodiment of the laser assembly 612 that is similar to the laser assembly 12 described above and illustrated in FIG. 4. However, in this embodiment, the reference redirector 620A is integrated and cut into the outer surface 6201 of the rear wall 620F. With this design, the test assembly (not shown) can direct the reference beam to the rear of the laser assembly 612. Alternatively, the reference redirector can be formed in one or more of the other walls.

Figure 7:
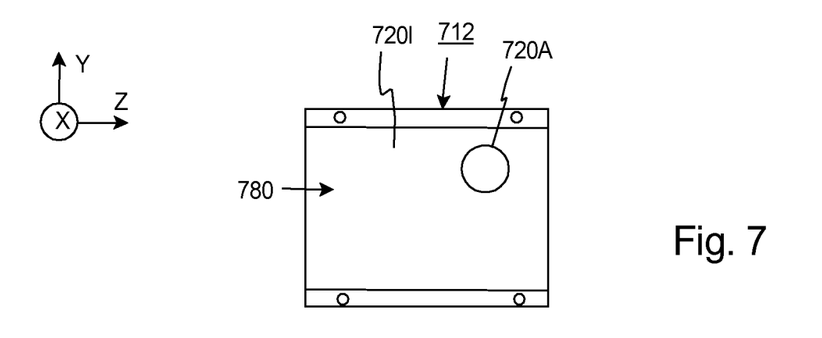
FIG. 7 is a simplified illustration of another embodiment of the laser assembly.

FIG. 7 is a simplified illustration of yet another embodiment of the laser assembly 710 that is similar to the laser assembly 12 described above and illustrated in FIG. 4. However, in this embodiment, the reference redirector 720A is integrated and cut into the outer surface 6201 of the top 780 of the laser housing 720. With this design, the test assembly (not shown) can direct the reference beam to the top 780 of the laser assembly 712.

While a number of exemplary aspects and embodiments of a laser assembly 12 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A laser assembly for providing an output beam, the laser assembly comprising:
   a gain medium that generates the output beam when electrical power is directed to the gain medium; and
   a laser housing that retains the gain medium, the laser housing including a reference redirector that is used to check the alignment of the output beam relative to the laser housing.

2. The laser assembly of claim 1 wherein the reference redirector is a mirror that is integrated into the laser housing.

3. The laser assembly of claim 2 wherein the reference redirector is cut into the laser housing.

4. The laser assembly of claim 2 wherein the reference redirector is formed by diamond cutting the laser housing to form the reference redirector.

5. The laser assembly of claim 1 wherein the laser housing includes an output wall that includes a transparent window that allows the output beam to pass there through, and wherein the reference redirector is formed on an outer surface of the front wall.

6. The laser assembly of claim 1 wherein the laser assembly includes an output lens that is secured to the laser housing, wherein the position of the output lens relative to the laser housing is adjusted to adjust the position of an output axis of the output beam relative to the laser housing.

7. The laser assembly of claim 1 wherein the reference redirector is used as a reference datum for precision angular alignment of the output beam relative to the laser housing.

8. The laser assembly of claim 1 wherein the reference redirector has a reflector surface that is at an angle of between approximately eighty-five to ninety degrees relative to the desired output axis.

9. The laser assembly of claim 1 wherein the gain medium is a quantum cascade or an interband cascade gain medium.

10. An assembly that includes the laser assembly of claim 1 and a test assembly that directs a reference beam at the reference redirector to check the alignment of the output beam relative to the laser housing.

11. The assembly of claim 10 wherein the test assembly splits the output beam to create the reference beam that is directed at the reference redirector.

12. The assembly of claim 10 wherein the test assembly includes a test laser source that generates the reference beam that is directed at the reference redirector.

13. A laser assembly for providing an output beam directed along an output axis, the laser assembly comprising:
   a gain medium that generates the output beam directed along the output axis when electrical power is directed to the gain medium; and
   a laser housing that retains the gain medium, the laser housing including a reference redirector that is used to check the alignment of the output beam relative to the laser housing, wherein the reference redirector is a mirror that is integrated into the laser housing; wherein the reference redirector is used as a reference datum for precision angular alignment of the output beam relative to the laser housing.

14. The laser assembly of claim 13 wherein the reference redirector is formed by diamond cutting the laser housing to form the reference redirector.

15. The laser assembly of claim 13 wherein the laser housing includes an output wall that includes a transparent window that allows the output beam to pass there through, and wherein the reference redirector is formed on an outer surface of the front wall; and wherein the gain medium is a quantum cascade or an interband cascade gain medium.

16. The laser assembly of claim 13 wherein the reference redirector has a reflector surface that is at an angle of between approximately eighty-five to ninety degrees relative to the desired output axis.

17. An assembly that includes the laser assembly of claim 13 and a test assembly that directs a reference beam at the reference redirector to check the alignment of the output beam relative to the laser housing.

18. A method for checking the alignment of an output beam directed along an output axis, the method comprising the steps of:
   directing power to a gain medium that emits the output beam directed along the output axis;
   retaining the gain medium with a laser housing that includes a reference redirector; and
   directing a reference beam at the reference redirector to check the alignment of the output beam relative to the laser housing.

19. The method of claim 18 wherein the step of retaining includes the reference redirector being a mirror that is integrated into the laser housing.

20. The method of claim 18 wherein the step of retaining includes the laser housing having an output wall that includes a transparent window that allows the output beam to pass there through, and wherein the reference redirector is formed on an outer surface of the front wall.

21. The method of claim 18 further comprising the step of adjusting a position of an output lens that is secured to the laser housing to adjust the position of the output axis relative to the laser housing.

22. The method of claim 18 wherein the step of directing a reference beam includes the step of using a test assembly to split the output beam to create the reference beam that is directed at the reference redirector.

23. The method of claim 18 wherein the step of directing a reference beam includes the step of using a test laser source to generate the reference beam that is directed at the reference redirector.

* * * * *